(12) United States Patent
Lee (10) Patent No.: US 7,906,986 B2
(45) Date of Patent: Mar. 15, 2011

(54) DATA OUTPUT DRIVING CIRCUIT FOR A SEMICONDUCTOR APPARATUS

(75) Inventor: Dong Uk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/959,401

(22) Filed: Dec. 18, 2007

(65) Prior Publication Data

US 2008/0278192 A1    Nov. 13, 2008

(30) Foreign Application Priority Data

May 10, 2007 (KR) .................. 10-2007-0045448

(51) Int. Cl.
*H03K 17/16* (2006.01)
(52) U.S. Cl. ............... 326/30; 326/26; 326/81; 326/83; 327/108
(58) Field of Classification Search ............ 326/30, 326/81–83, 86–87, 21, 26; 327/108–109
See application file for complete search history.

(56) References Cited

U.S. PATENT DOCUMENTS

| 6,762,620 | B2 | * | 7/2004 | Jang et al. ................. 326/30 |
| 7,019,555 | B2 | | 3/2006 | Lee |
| 7,020,818 | B2 | * | 3/2006 | Dour et al. ............... 714/724 |
| 7,034,567 | B2 | | 4/2006 | Jang |
| 7,176,729 | B2 | * | 2/2007 | Hayashi et al. ........... 327/108 |
| 7,382,152 | B2 | * | 6/2008 | Hamanaka ................. 326/30 |
| 7,417,452 | B1 | * | 8/2008 | Wang et al. ................ 326/30 |
| 7,589,554 | B2 | * | 9/2009 | Hamanaka ................. 326/30 |
| 2005/0180229 | A1 | | 8/2005 | Jin |
| 2005/0268059 | A1 | | 12/2005 | LaBerge |

FOREIGN PATENT DOCUMENTS

| JP | 2004310981 | 11/2004 |
| JP | 2005228458 | 8/2005 |
| KR | 1020050100290 A | 10/2005 |

* cited by examiner

*Primary Examiner* — James H. Cho
*Assistant Examiner* — Christopher Lo
(74) *Attorney, Agent, or Firm* — Baker & McKenzie LLP (57) ABSTRACT

A data output driving circuit for a semiconductor apparatus includes a code converter that varies an input on-die termination code according to a control signal and outputs the code, and a driver block having impedance which can be modified according to the code generated by the code converter.

9 Claims, 8 Drawing Sheets

DATA OUTPUT DRIVING CIRCUIT FOR A SEMICONDUCTOR APPARATUS

CROSS-REFERENCE TO RELATED PATENT APPLICATION

The present application claims priority under 35 U.S.C. 119(a) to Korean Application number 10-2007-0045448, filed on May 10, 2007, in the Korean Patent Office, which is incorporated by reference in its entirety s if set forth in full.

BACKGROUND

1. Technical Field

The embodiments described herein relate to a semiconductor apparatus, and more particularly, to a data output driving circuit for a semiconductor apparatus.

2. Related Art

Figure 1:
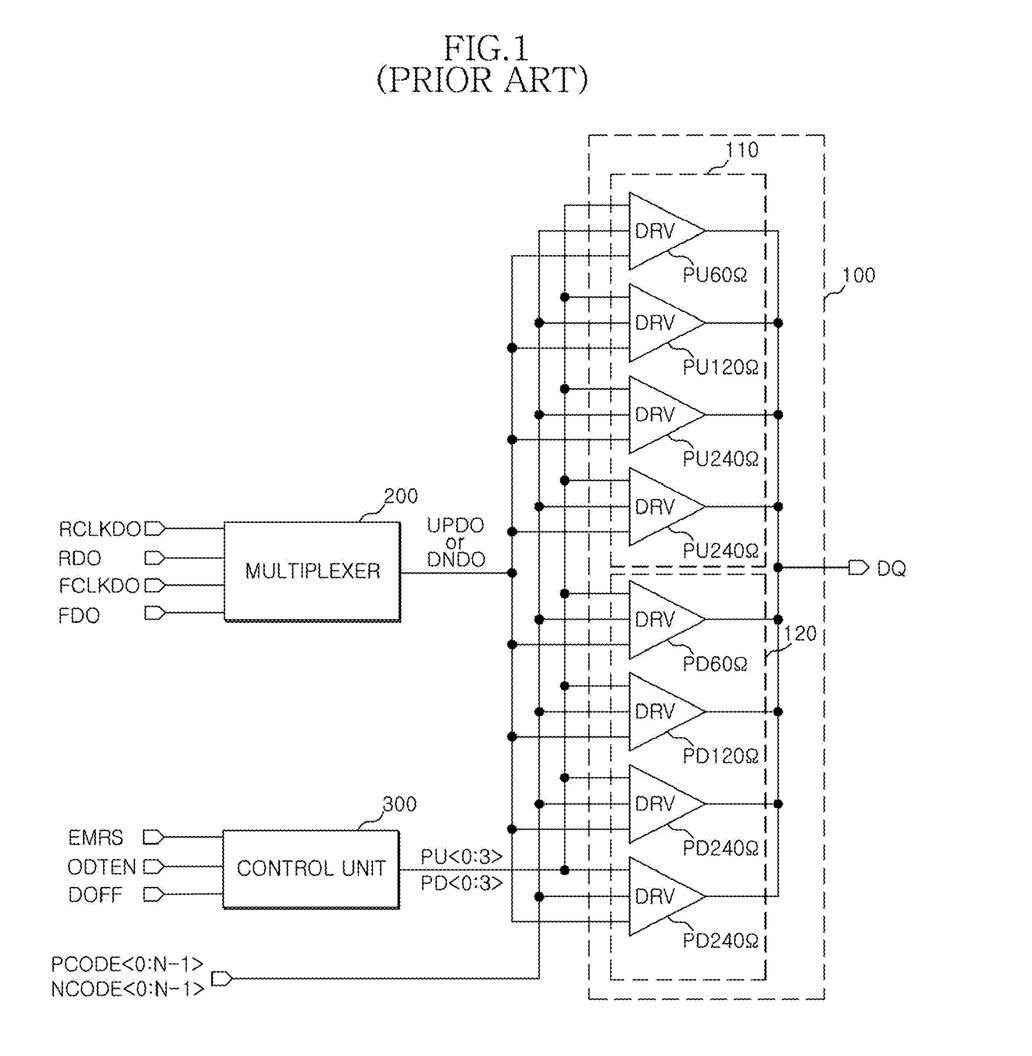
FIG. 1 is a block diagram illustrating a conventional data output driving circuit for a semiconductor apparatus.

As shown in FIG. 1, a conventional data output driving circuit for a semiconductor apparatus includes a driver block 100, a multiplexer 200, and a control unit 300.

A driver block 100 includes a pull-up driver block 110 and a pull-down driver block 120.

Figure 2:
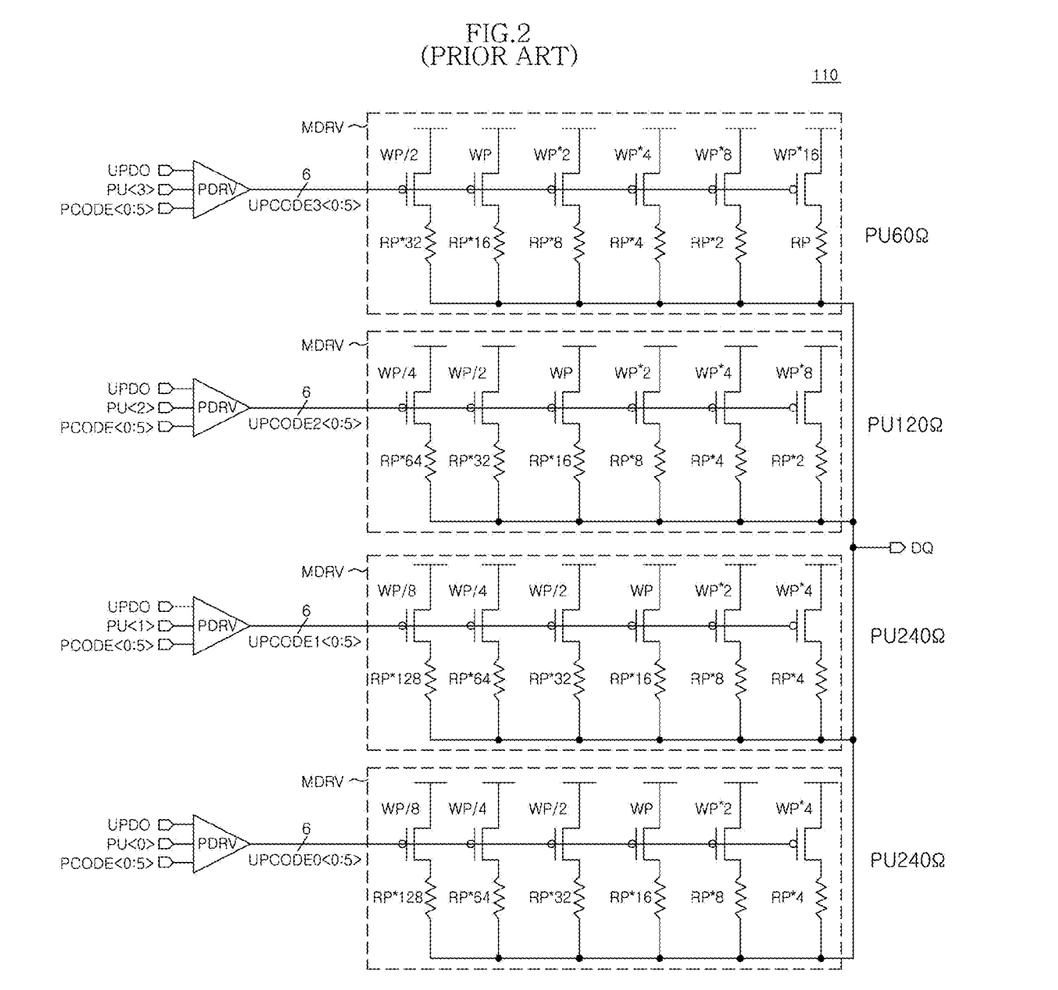
FIG. 2 is a circuit diagram illustrating a pull-up driver block that can be included in the circuit illustrated in FIG. 1.

A multiplexer 200 can receive clock signals (RCLKDO) and (FCLKDO) and parallel 2-bit data (RDO) and (FDO), and output serial one-bit data (UPDO) and (DNDO). A control unit 300 can receive a driver off signal (DOFF), an on-die termination enable signal (ODTEN), and a code signal (EMRS) output from an extended mode register set EMRS in order to determine driver strength, that is, an impedance. In response, the control unit can output driver selection signals (PU<0:3>) and (PD<0:3>). As shown in FIG. 2, a pull-up driver block 110 includes four pull-up drivers PU60Ω, PU120Ω, PU240Ω, and PU240Ω. Each of the four pull-up drivers PU60Ω, PU120Ω, PU240Ω, and PU240Ω includes a pre-driver PDRV and a main driver MDRV.

A pre-driver PDRV of the pull-up driver PU60Ω receives a one-bit serial data signal (UPDO), the driver selection signal (PU<3>), and the on-die termination codes (PCODE<0:5>). PDRV then outputs control codes (UPCODE3<0:5>). The main driver MDRV of the pull-up driver PU60Ωincludes a plurality of transistors, each having a source connected to a power supply terminal and a gate to which the control code (UPCODE3<0:5>) is input, and a plurality of resistors.

One end of each of a plurality of resistors is connected to the drain of the corresponding transistor, and the other end of each of resistors is connected to a common terminal. In one embodiment, the pull-up drivers PU120Ω and PU240Ω have the same structure as the pull-up driver PU60Ω, but when the impedances of the pull-up drivers are different from each other, the transistors have different widths and the resistors have different resistance values in the main drivers MDRV of the pull-up drivers.

The resistance values of the resistors forming the main driver MDRV increase proportional to impedance, and the widths of the transistors decrease inversely proportional to impedance. For example, as shown in FIG. 2, the resistance value of the pull-up driver PU120Ω is two times greater than that of the pull-up driver PU60Ω, and the width of the transistor in the pull-up driver PU120Ω is half the width of the transistor in the pull-up drivers PU60Ω. The resistance value of the pull-up driver PU240Ω is two times greater than that of the pull-up driver PU120Ω, and the width of the transistor in the pull-up driver PU240Ω is half the width of the transistor in the pull-up drivers PU120Ω.

For reference, a transistor WP has a reference width, and a transistor WP/8 has a width that is one-eighth of the reference width of the transistor WP. A transistor WP*16 has a width that is 16 times larger than the reference width of the transistor WP. A resistor RP has a reference resistance value, and a resistor RP*128 has a resistance value that is 128 times greater than the reference resistance value of the resistor RP.

Figure 3:
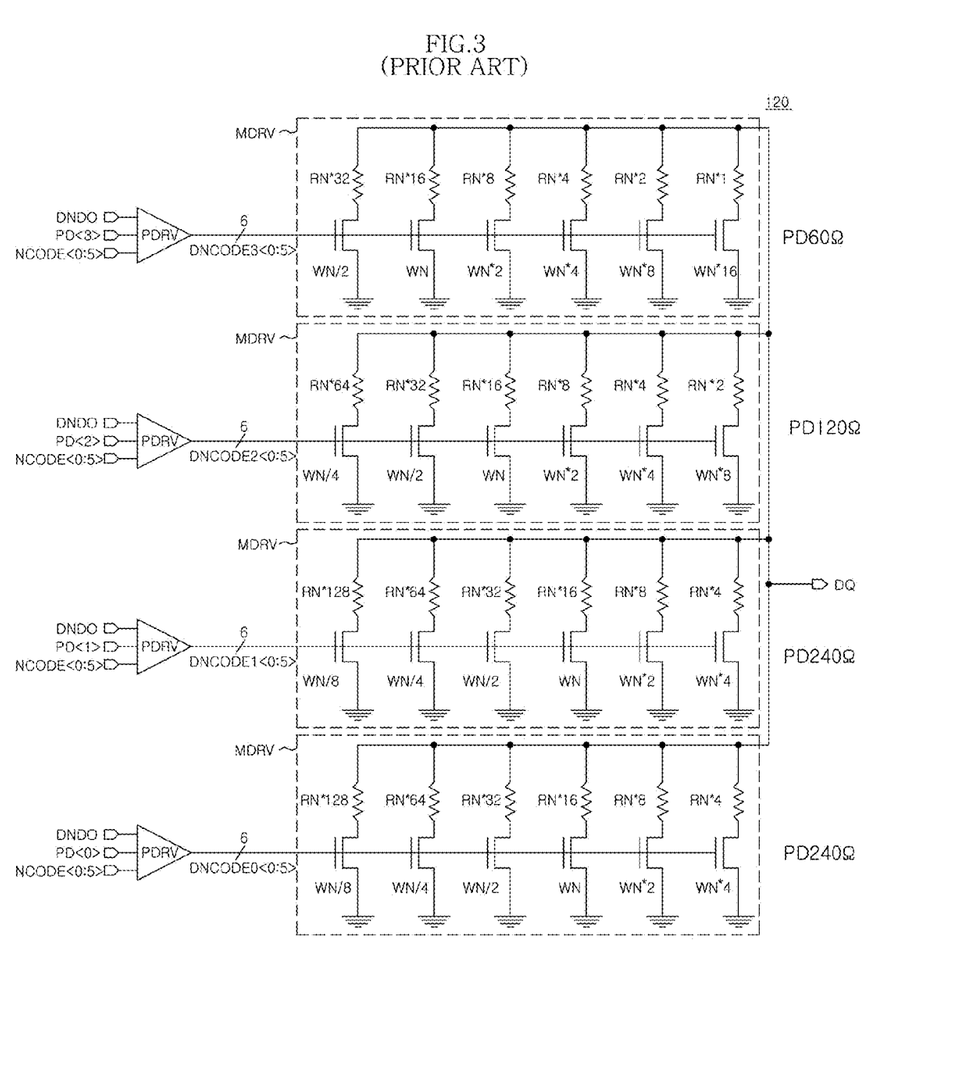
FIG. 3 is a circuit diagram illustrating a pull-down driver block that can be included in the circuit illustrated in FIG. 1.

As shown in FIG. 3, a conventional pull-down driver block 120 includes four pull-down drivers PD60Ω, PD120Ω, PD240Ω, and PD240Ω. Each of the four pull-down drivers PD60Ω, PD120Ω, PD240Ω, and PD240Ω includes a set of a pre-driver PDRV and a main driver MDRV.

A pre-driver PDRV of the pull-down driver PD60Ω receives one-bit serial data (DNDO), a driver selection signal (PD<3>), and on-die termination codes (NCODE<0:5>), and outputs control codes (DNCODE3<0:5>). A main driver MDRV of the pull-down driver PD60Ω can include a plurality of transistors, each having a source connected to a ground terminal and a gate to which the control code (DNCODE3<0:5>) is input, and a plurality of resistors. One end of each resistor is connected to the drain of the corresponding transistor, and the other end each resistor is connected to a common terminal.

The pull-down drivers PD120Ω and PD240Ω, in this embodiment, have the same structure as the pull-down driver PD60Ω. However if the impedances of the pull-down drivers are different from each other, the transistors have different widths and the resistors have different resistance values in the main drivers MDRV of the pull-down drivers. That is, the structural principle of the pull-down drives is the same as that of the pull-up drives shown in FIG. 2. For instance, a transistor WN has a reference width, and a transistor WN/8 has a width that is one-eighth of the reference width of the transistor WN. A transistor WN*16 has a width that is 16 times larger than the reference width of the transistor WN. A resistor RN has a reference resistance value, and a resistor RN*128 has a resistance value that is 128 times greater than the reference resistance value of the resistor RN.

A conventional multiplexer 200 converts parallel 2-bit data (RDO) and (FDO) into serial one-bit data (UPDO) and (DNDO) according to clock signals (RCLKDO) and (FCLKDO), and outputs the converted data. The extended mode register set EMRS outputs a code signal (EMRS) for determining the strength of the driver block 100.

A conventional control unit 300 determines the operation mode of the driver block 100 on the basis of the on-die termination enable signal (ODTEN) and the driver off signal (DOFF), and outputs the driver selection signals (PU<0:3>) and (PD<0:3>) according to the operation mode.

When a data input operation is performed in a conventional semiconductor apparatus, the driver off signal (DOFF) is deactivated, and the on-die termination enable signal (ODTEN) is activated. Then, the control unit 300 activates only the driver selection signals (PU<0:3>) among the driver selection signals (PU<0:3>) and (PD<0:3>) to control the driver block 100 to perform an on-die termination operation, thereby operating only the pull-up driver block 110 of the driver block 100.

The on-die termination strength, that is, the impedance of the driver block 100 is determined by the on-die termination codes (PCODE<0:5>) and (NCODE<0:5>).

When a data output operation is performed in such a semiconductor apparatus, both the driver off signal (DOFF) and the on-die termination enable signal (ODTEN) are deactivated. Then, the control unit 300 activates all of the driver selection signals (PU<0:3>) and (PD<0:3>) to control the driver block 100 to perform the data output operation, thereby operating both the pull-up driver block 110 and the pull-down driver block 120 of the driver block 100.

The driving impedances of the pull-up driver block 110 and the pull-down driver block 120 of the driver block 100 are determined by the driver selection signals (PU<0:3>) and (PD<0:3>) output from the control unit 300. The driver block 100 drives the data (UPDO) and (DNDO) according to the determined impedance, and outputs the data.

For example, the four pull-up drivers PU60Ω, PU120Ω, PU240Ω, and PU240Ω are all enabled in order to obtain a strength of 30 Ω. When the four pull-up drivers PU60Ω, PU120Ω, PU240Ω, and PU240Ω are all enabled, a resultant impedance of 30 Ω (1/(1/60+1/120+1/240+1/240)=240/8=30Ω) is obtained by using an equation for calculating parallel resistance.

For example, the pull-up drivers PU60Ω and PU120Ω among the four pull-up drivers PU60Ω, PU120Ω, PU240Ω, and PU240Ω are enabled in order to obtain a strength of 40 Ω. When the pull-up drivers PU60Ω and PU120Ω are enabled, a resultant impedance of 40 Ω (1/(1/60+1/120)=120/3=40 Ω) is obtained by using the equation for calculating parallel resistance.

When neither the data input operation nor the data output operation is performed in the semiconductor apparatus, the driver off signal (DOFF) is activated, and the on-die termination enable signal (ODTEN) is deactivated. Then, the control unit 300 deactivates all of the driver selection signals (PU<0:3>) and (PD<0:3>) to turn off both the pull-up driver block 110 and the pull-down driver block 120 in the driver block 100.

As described above, the data output driving circuit of the semiconductor apparatus requires many drivers in order to achieve various driving strengths and on-die termination strengths. In particular, since the 120-ohm and 240-ohm drivers have larger areas than the 60-ohm driver, the ratio of the area of the data output driving circuit to the area of the semiconductor apparatus increases. This results in a reduction in the layout margin.

SUMMARY

Embodiments described herein provide a data output driving circuit for a semiconductor apparatus capable of reducing a layout area.

According to one embodiment, a data output driving circuit can be configured to include a code converter that varies an input on-die termination code according to one or more control signals and outputs a code. In response, a driver block can change its impedance according to the code output generated by the code converter.

According to another embodiment, a data output driving circuit can comprise: a code converter that can vary an input code according to one or more control signals and output a code; a control unit that can output a driver selection signal according to the operation mode of the semiconductor apparatus; and a driver block that can includes a plurality of drivers. In the data output driving circuit, each driver can be selectively activated according to the driver selection signal, and the impedances of some of the drivers can be changed by the code converter.

According to another embodiment, a data output driving circuit can comprise: a code converter that shifts a primary code to a secondary code according to a control signal and outputs the shifted code; and a driver block which can include a general driver, with a predetermined impedance, that receives the primary code and a variable driver, with two or more different impedance values, that can receive the secondary code.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 4:
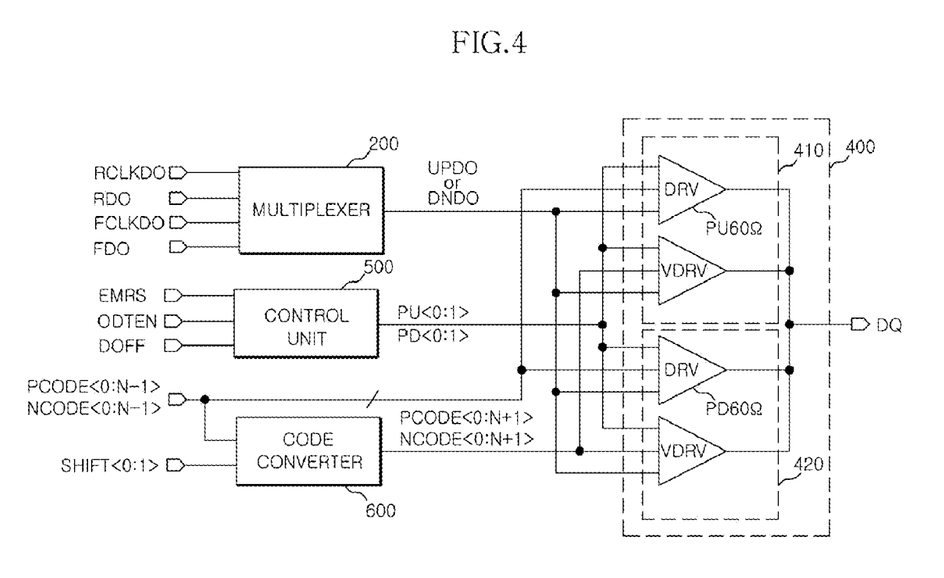
FIG. 4 is a block diagram illustrating a data output driving circuit for a semiconductor apparatus according to one embodiment.

As shown in FIG. 4, a data output driving circuit of the semiconductor apparatus according to one embodiment can be configured to include a multiplexer 200, a driver block 400, a control unit 500, and a code converter 600. The multiplexer 200 can receive clock signals (RCLKDO) and (FCLKDO) and parallel 2-bit signals (RDO) and (FDO), and outputs serial one-bit signals (UPDO) and (DNDO).

The control unit 500 can be configured to receive a driver off signal (DOFF), an on-die termination enable signal (ODTEN), and a code signal (EMRS) output from an extended mode register set EMRS in order to determine the driver strength and impedance, and output driver selection signals (PU<0:1>) and (PD<0:1>).

The driver block 400 can be configured to selectively activate a driver according to the driver selection signals (PU<0:1>) and (PD<0:1>). Additionally, the impedances of the drivers can be changed according to on-die termination codes (PCODE<0:N−1>) and (NCODE<0:N−1>) and impedance changing codes (PCODE<0:N+1>) and (NCODE<0:N+1>), which can be generated by the code converter 600.

Figure 5:
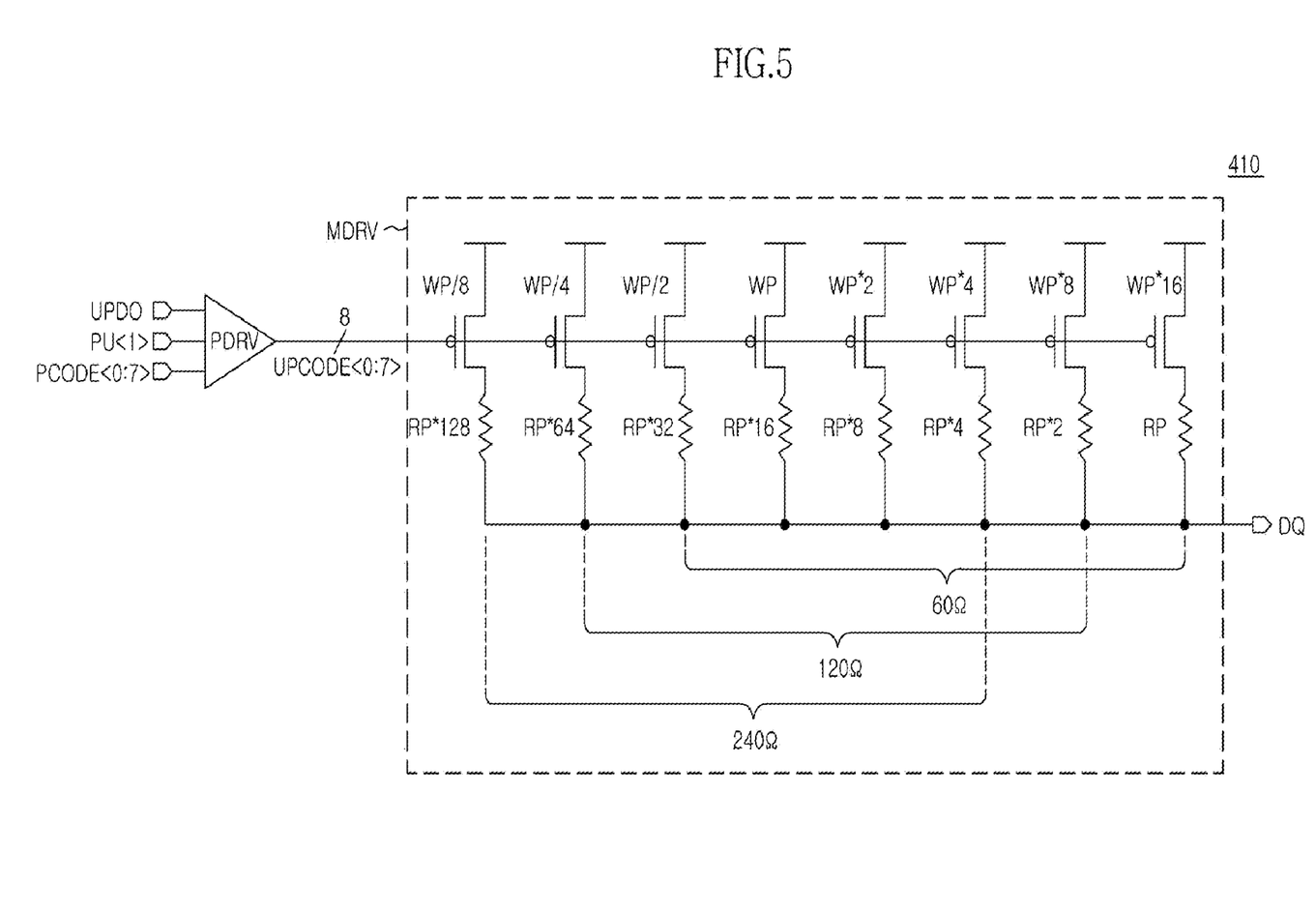
FIG. 5 is a circuit diagram illustrating a pull-up driver block that can be included in the circuit illustrated in FIG. 4.

The driver block 400 includes a pull-up driver block 410 and a pull-down driver block 420. The pull-up driver block 410 can be configured to include a general driver DRV, which can obtain on-die termination impedance according to the on-die termination codes (PCODE<0:N−1>), and a variable driver VDRV, which can change its impedance according to the impedance changing codes (PCODE<0:N+1>). The general driver DRV of the pull-up driver block 410 can have the same structure as shown in FIG. 2. The variable driver VDRV of the pull-up driver block 410 can include a pre-driver PDRV and a main driver MDRV, as shown in FIG. 5.

The pre-driver PDRV can output codes (UPCODE<0:7>). This code can be obtained by pre-driving the impedance changing codes (PCODE<0:7>), and corresponds to data (UPDO) and a driver selection signal (PU<1>).

The main driver MDRV can include a plurality of impedance units, each of which can comprise a transistor and a resistor. FIG. 5 reflects one embodiment that comprises eight transistors (WP/8 to WP16) connected to a power supply terminal and connected to eight resistors (RP128 to RP), which can be connected between the eight transistors (WP/8 to WP16) and a data output terminal. Among the transistors WP/8 to WP16 shown in FIG. 5, the transistor WP has a reference width, and the transistor WP/8 has a width that is one-eighth of the reference width of the transistor WP. The transistor WP16 has a width that is 16 times larger than the reference width of the transistor WP. Among the resistors RP128 to RP shown in FIG. 5, the resistor RP has a reference resistance value, and the resistor RP128 has a resistance value that is 128 times greater than the reference resistance value of the resistor RP. Unlike a conventional pull-up driver, the main driver MDRV can be configured with a plurality of additional transistors and resistors which enables MDRV to receive additional bits. For instance, in FIG. 5, MDRV can include two additional transistors and two additional resistors which enables MDRV to receive two additional bits. In the embodiment described, this feature allows the main driver MDRV to achieve a 60-ohm driver, a 120-ohm driver, and a 240-ohm driver. The 120-ohm driver can be realized by shifting a code input to the 60-ohm driver by one bit. Similarly the 240-ohm driver is realized by shifting the code input to the 60-ohm driver by two bits.

Figure 6:
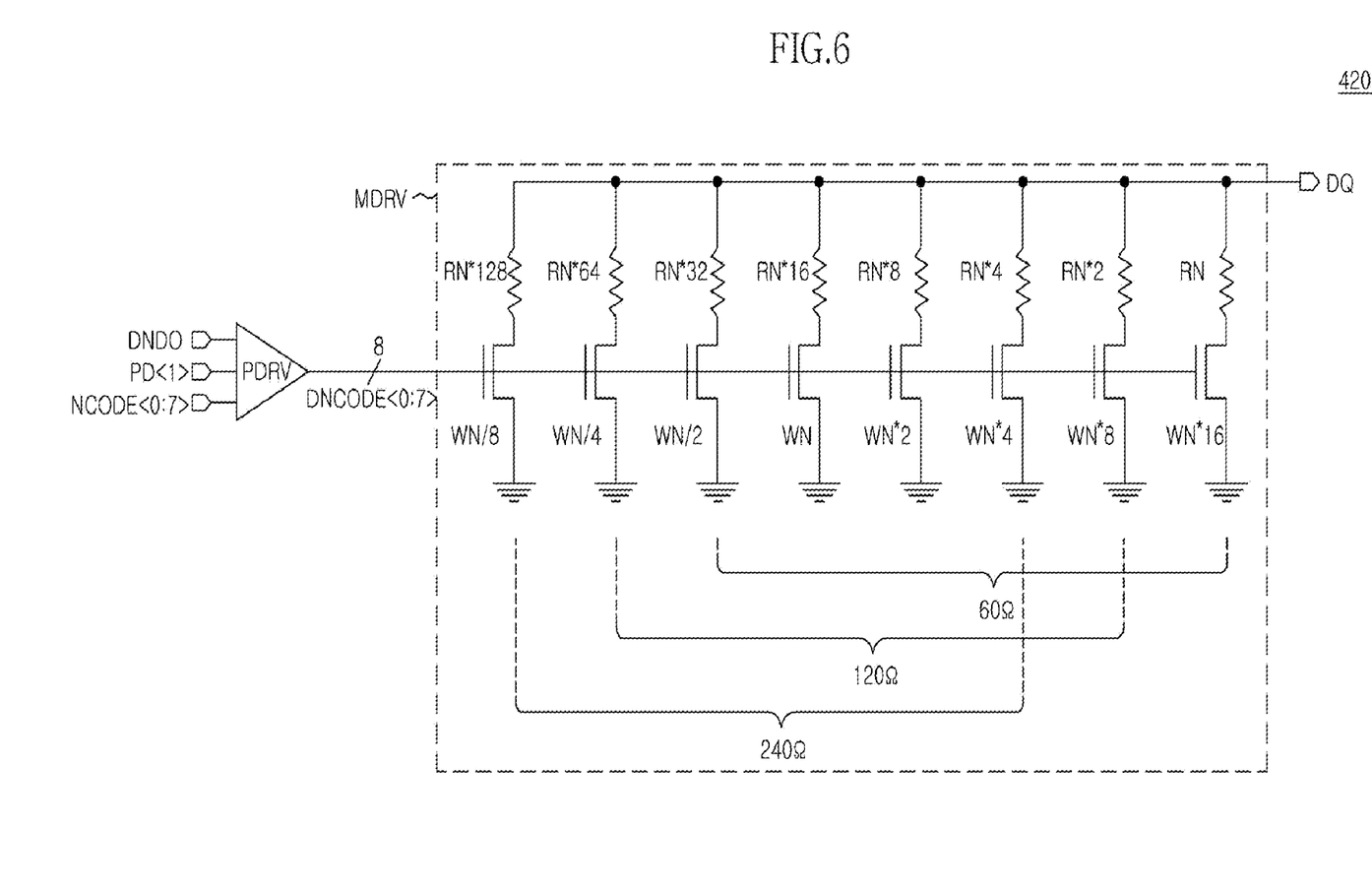
FIG. 6 is a circuit diagram illustrating a pull-down driver block that can be included in the circuit illustrated in FIG. 4.

FIG. 6 is a circuit diagram illustrating a pull-down driver block that can be included in the circuit illustrated in FIG. 4. As shown in FIG. 6, The pull-down driver block 420 can include a general driver DRV, which can obtain on-die termination impedance according to the on-die termination codes (NCODE<0:N−1>) and a variable driver VDRV, which can change its impedance according to the impedance changing codes (NCODE<0:N+1>).

In one embodiment, the general driver DRV of the pull-down driver block 420 can have the same structure as shown in FIG. 3. The variable driver VDRV of the pull-down driver block 420 can include a pre-driver (PU<0:3>) and a main driver (MDRV), as shown in FIG. 6.

The pre-driver PDRV can output codes (DNCODE<0:7>) obtained by pre-driving the impedance changing codes (NCODE<0:7>). This output code corresponds to data (DNDO) and a driver selection signal (PD<1>).

The main driver MDRV can include a plurality of impedance units, each of which can comprise a transistor and a resistor. The main driver MDRV can include eight transistors (WN/8 to WN16) connected to the power supply terminal and eight resistors RN128 to RN. In turn, the resistors can be connected between the eight transistors (WN/8 to WN16) and a data output terminal. Among the transistors (WN/8 to WN16) shown in FIG. 6, the transistor WN has a reference width, and the transistor WN/8 has a width that is one-eighth of the reference width of the transistor WN. The transistor WN16 has a width that is 16 times greater than the reference width of the transistor WN. Among the resistors RN128 to RN shown in FIG. 6, the resistor RN has a reference resistance value, and the resistor RN128 has a resistance value that is 128 times greater than the reference resistance value of the resistor RN. Unlike a conventional main driver, the main driver MDRV shown in FIG. 6 can include two additional transistors and two additional resistors to receive two additional bits. Thus, the main driver MDRV, according to one embodiment, can achieve all of the 60-ohm, 120-ohm, and 240-ohm drivers. Among the 60-ohm driver, the 120-ohm driver, and the 240-ohm driver, the 120-ohm driver is realized by shifting a code input to the 60-ohm driver by one bit, and the 240-ohm driver is realized by shifting the code input to the 60-ohm driver by two bits.

Figure 7:
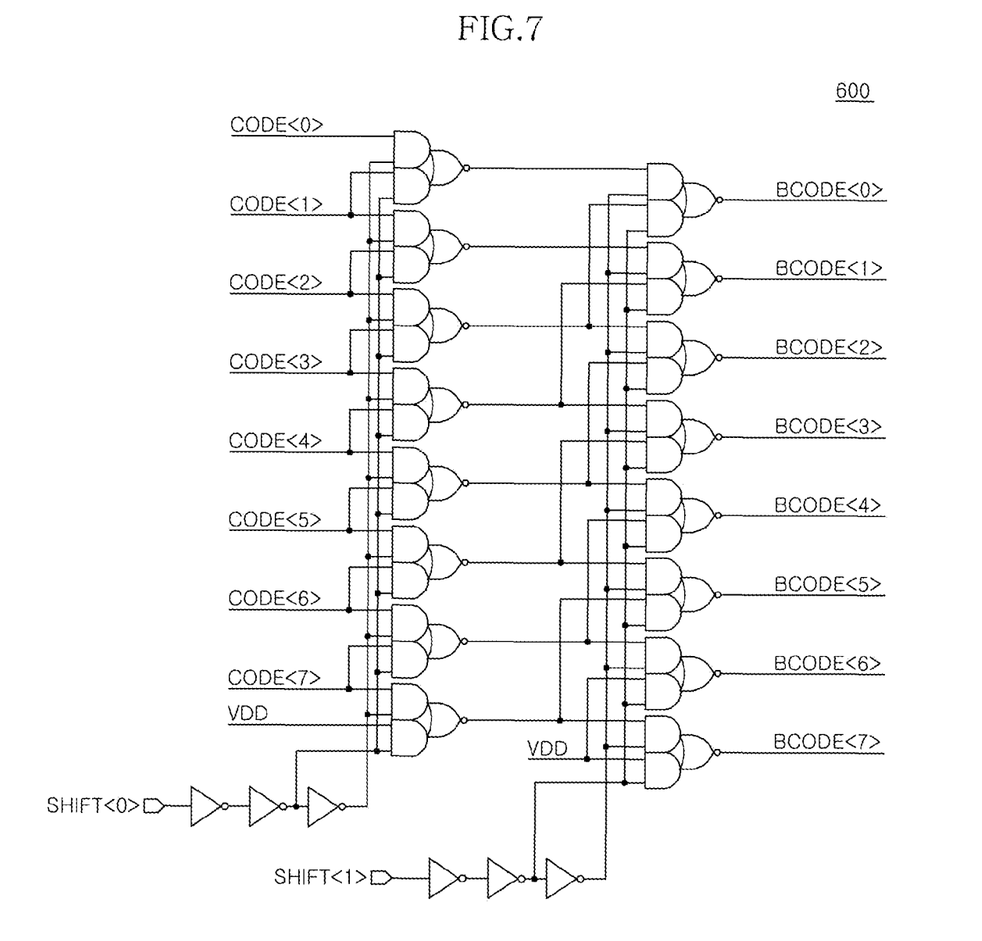
FIG. 7 is a circuit diagram illustrating a code converter that can be included in the circuit illustrated in FIG. 4.

FIG. 7 is a circuit diagram illustrating a code converter that can be included in the circuit illustrated in FIG. 4. As shown in FIG. 7, a code converter 600 can comprise a barrel shifter that can shift data toward the left side or the right side by a desired number of bits. The code converter 600 can include two barrel shifters since two types of on-die termination codes (PCODE<0:N−1>) and (NCODE<0:N−1>) are used.

Figure 8:
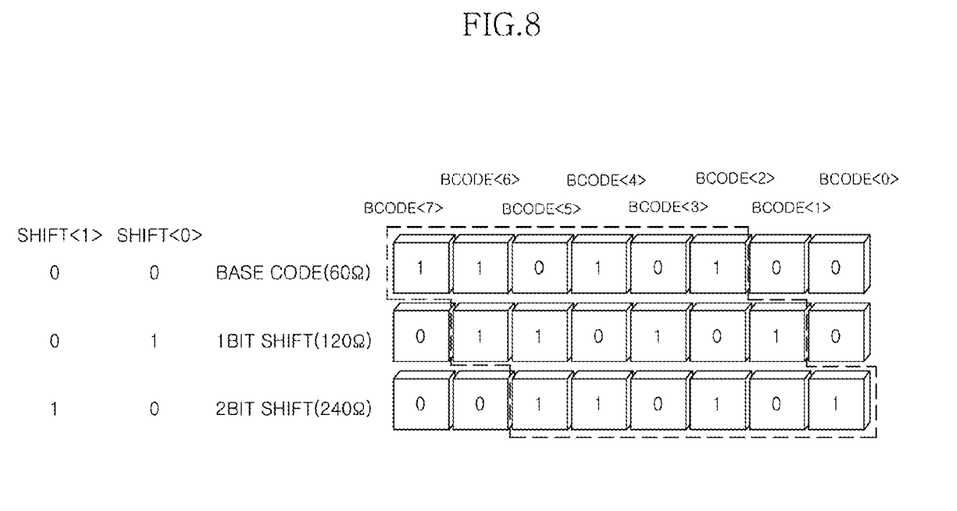
FIG. 8 is a conceptual diagram illustrating the operation of the code converter.

FIG. 8 is a conceptual diagram illustrating the operation of a code converter that can be included in the circuit illustrated in FIG. 7. As can be seen, the barrel shifter can be configured to shift an input code signal according to control signals (SHIFT<0:1>) and outputs the shifted signal. For example, when the control signal (SHIFT<0:1>) is '00', the barrel shifter can output a code (CODE<0:7>)(11010100) as a code (BCODE<0:7>)(11010100).

In one embodiment, when the control signal (SHIFT<0:1>) is '01', the barrel shifter shifts the code (CODE<0:7>) (11010100) by one bit, and outputs a code (BCODE<0:7>) (01101010). When the control signal (SHIFT<0:1>) is '10', the barrel shifter shifts the code (CODE<0:7>)(11010100) by two bits, and outputs a code (BCODE<0:7>)(00110101). A resister value of the extended mode register set (EMRS) can be used as the control signal (SHIFT<0:1>). Codes (CODE<2:7>) correspond to the on-die termination code (PCODE<0:N−1>) and (NCODE<0:N−1>), and codes (BCODE<0:7>) correspond to the impedance changing codes (PCODE<0:N+1>) and (NCODE<0:N+1>).

In one embodiment, the data output driving circuit has a multiplexer 200, which can convert parallel 2-bit data (RDO) and (FDO) into serial one-bit data (UPDO) and (DNDO) according to clock signals (RCLKDO) and (FCLKDO), and output the converted data. In one embodiment, an extended mode register set EMRS can output a code signal (EMRS) to determine the strength of the driver block 400. Additionally, the control unit 500 determines the operation mode of the driver block 400 based on the on-die termination enable signal (ODTEN) and the driver off signal (DOFF), and can be configured to then output the driver selection signals (PU<0:1>) and (PD<0:1>) according to the operation mode.

When neither a data input operation nor a data output operation is performed in the semiconductor apparatus, the driver off signal (DOFF) can be enabled, and the on-die termination enable signal (ODTEN) can be disabled. Then, the control unit 500 can disable all of the driver selection signals (PU<0:1>) and (PD<0:1>), which turns off both the pull-up driver block 410 and the pull-down driver block 420 in the driver block 400.

Furthermore, when the data input operation is performed in the semiconductor apparatus, the driver off signal (DOFF) can be disabled, and the on-die termination enable signal (ODTEN) can be enabled. Then, the control unit 500 enables only the driver selection signals (PU<0:1>) among the driver selection signals (PU<0:1>) and (PD<0:1>) to control the driver block 400 to perform an on-die termination operation, thereby operating only the pull-up driver block 410 of the driver block 400.

When the data output operation is performed in the semiconductor apparatus, both the driver off signal (DOFF) and the on-die termination enable signal (ODTEN) can be disabled. Then, the control unit 500 can enable all of the driver selection signals (PU<0:1>) and (PD<0:1>), control the driver block 400 to perform a data output operation, thereby operating both the pull-up driver block 410 and the pull-down driver block 420 of the driver block 400.

An impedance of 60 Ω can be set to the general driver DRV of the driver block 400 according to the on-die termination codes (PCODE<0:5>) and (NCODE<0:5>), and the variable driver VDRV can be set to an impedance of 60 Ω, 120 Ω, or 240 Ω according to the impedance changing codes (PCODE<0:7>) and (NCODE<0:7>). The general driver DRV or the variable driver VDRV can be selectively activated according to the driver selection signals (PU<0:1>) and (PD<0:1>) which is generated by the controller 500, such that the final driving strength can be determined by a combination of the general driver DRV and a variable driver VDRV. Thus, in one embodiment the driver block 400 can use the determined driving strength to drive and generate the output data (UPDO) and (DNDO).

For example, in order to obtain a strength of 30 Ω, both the general driver DRV and the variable driver VDRV of the driver block 400 can be activated, and the impedance of the variable driver VDRV can be set to 60 Ω. As shown in FIG. 8, when the control signal (SHIFT<0:1>) is input into the code converter 600 and is set to '00', the impedance of the variable driver VDRV can be set to 60 Ω by the impedance changing codes (PCODE<0:7>) and (NCODE<0:7>) generated by the code converter 600. When the impedances of the general driver DRV and the variable driver VDRV are set to 60 Ω, a resultant impedance of 30 Ω (1/(1/60+1/60)=60/2=30 Ω) is obtained by a standard equation for calculating parallel resistance.

In another example, in order to obtain a strength of 40 Ω, both the general driver DRV and the variable driver VDRV of the driver block 400 can be activated, and the impedance of the variable driver VDRV can be set to 120 Ω. As shown in FIG. 8, when the control signal (SHIFT<0:1>) input to the code converter 600 is set to '01', the impedance of the variable driver VDRV can be set to 120 Ω by the impedance changing codes (PCODE<0:7>) and (NCODE<0:7>), which is generated by the code converter 600. When the impedances of the general driver DRV is set to 60 Ω and the impedance of the variable driver VDRV is set to 120 Ω, a resultant impedance of 40 Ω (1/(1/60+1/120)=120/3=40 Ω) is obtained by the standard equation for calculating parallel resistance.

For example, in order to obtain a strength of 60 Ω, either the general driver DRV or the variable driver VDRV of the driver block 400 can be activated, and the impedance of the variable driver VDRV is set to 60Ω.

For example, in order to obtain a strength of 240 Ω, only the variable driver VDRV of the driver block 400 can be activated, and the impedance of the variable driver VDRV can be set to 240 Ω. As shown in FIG. 8, when the control signal (SHIFT<0:1>) input to the code converter 600 is set to '10', the impedance of the variable driver VDRV can be changed to 240 Ω by the impedance changing codes (PCODE<0:7>) and (NCODE<0:7>) and generated by the code converter 600.

As described in the embodiments above, a data output driving circuit of the semiconductor has the following advantages: First, it is possible to obtain various driver strengths by using a smaller number of drivers than that in the related art, and thus reduce a layout area. Second the embodiments described herein, allow for the reduction of parasitic capacitance between resistors and transistors by reducing the number of drivers.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data output driving circuit for a semiconductor apparatus, comprising:
    a code converter that shifts an n-bit on-die termination code according to a control signal and outputs a shifting code that has an increased number of bits in comparison with the on-die termination code; and
    a driver block that receives the n-bit on-die termination code and the shifting code output from the code converter and has impedance changed according to the on-die termination code and the shifting code,
    wherein n is an integer greater than one,
    wherein the driver block includes:
        a pull-up driver block that is composed of a driver set including one or more variable drivers having variable impedances; and
        a pull-down driver block that is composed of a driver set including one or more variable drivers having variable impedances, and
    wherein the variable driver includes:
        a pre-driver that pre-drives the shifting code output from the code converter according to whether the driver is selected; and
        a main driver that includes a plurality of impedance units, each of which comprises a transistor and a resistor coupled serially between a power supply terminal and a data output terminal, and has impedance changed according to the shifting code output from the pre-driver.

2. The data output driving circuit of claim 1, wherein the plurality of transistors are arranged such that the ratio of the width thereof to a reference width increases in multiples of 2 from one-eighth to 16, or that the ratio of the width thereof to the reference width decreases in multiples of 2 from 16 to one-eighth.

3. The data output driving circuit of claim 1, wherein the plurality of resistors are arranged such that the ratio of the resistance value thereof to a reference resistance value increases in multiples of 2 from 1 to 128, or that the ratio of the resistance value thereof to the reference resistance value decreases in multiples of 2 from 128 to 1.

4. The data output driving circuit of claim 1, further comprising:
    a control unit that selectively operate the driver sets of the driver block.

5. The data output driving circuit of claim 4, wherein the control unit generates the driver selection signal according to a register value stored in a mode register set.

6. A data output driving circuit for a semiconductor apparatus, comprising:
    a code converter that shifts an n-bit input code according to a control signal and outputs a shifting code that has an increased number of bits in comparison with the input code;
    a control unit that outputs a driver selection signal according to an operation mode of the semiconductor apparatus; and
    a driver block that includes a plurality of drivers,
    wherein all the drivers are selectively activated according to the driver selection signal, and
    the impedances of some of the drivers are determined according to the n-bit input code, and the impedances of the other of the drivers are changed according to the shifting code output from the code converter,
    wherein n is an integer greater than one, wherein the driver block includes:
- a pull-up driver block that is composed of a driver set including one or more variable drivers having variable impedances; and
- a pull-down driver block that is composed of a driver set including one or more variable drivers having variable impedances, and wherein the variable driver includes:
- a pre-driver that pre-drives the shifting code output from the code converter according to whether the driver is selected; and
- a main driver that includes a plurality of impedance units, each of which comprises a transistor and a resistor coupled serially between a power supply terminal and a data output terminal, has impedance changed according to the shifting code output from the pre-driver.

7. The data output driving circuit of claim 6, wherein the control unit generates the driver selection signal according to a register value stored in a mode register set.

8. The data output driving circuit of claim 6, wherein the plurality of transistors are arranged such that the ratio of the width thereof to a reference width increases in multiples of 2 from one-eighth to 16, or that the ratio of the width thereof to the reference width decreases in multiples of 2 from 16 to one-eighth.

9. The data output driving circuit of claim 6, wherein the plurality of resistors are arranged such that the ratio of the resistance value thereof to a reference resistance value increases in multiples of 2 from 1 to 128, or that the ratio of the resistance value thereof to the reference resistance value decreases in multiples of 2 from 128 to 1.

* * * * *